United States Patent [19]
Steinebach

[11] Patent Number: 5,822,229
[45] Date of Patent: Oct. 13, 1998

[54] CIRCUIT ARRANGEMENT FOR FREQUENCY MULTIPLICATION

[75] Inventor: Wolfgang Steinebach, Salz, Germany

[73] Assignee: U.S. Philips Corporation, New York, N.Y.

[21] Appl. No.: 642,669

[22] Filed: May 3, 1996

Related U.S. Application Data

[63] Continuation of Ser. No. 328,995, Oct. 25, 1994, abandoned.

[30] Foreign Application Priority Data

Oct. 27, 1993 [DE] Germany .......................... 43 36 655.4

[51] Int. Cl.⁶ ........................................................ G06F 7/52
[52] U.S. Cl. ............................................. 364/703; 377/57

[56] References Cited

U.S. PATENT DOCUMENTS

| | | | |
|---|---|---|---|
| 4,017,719 | 4/1977 | Kaplan et al. | 377/47 |
| 4,071,743 | 1/1978 | Upton | 377/47 |
| 4,086,471 | 4/1978 | Takahashi . | |
| 4,112,492 | 9/1978 | Summers | 377/47 |
| 4,242,639 | 12/1980 | Boone | 364/703 |
| 4,328,484 | 5/1982 | Denecke | 377/47 |
| 4,339,722 | 7/1982 | Sydor et al. | 377/47 |
| 4,669,099 | 5/1987 | Zinn | 364/703 |
| 4,773,031 | 9/1988 | Tobin | 364/703 |
| 4,941,160 | 7/1990 | Sheahan | 377/47 |

FOREIGN PATENT DOCUMENTS

| | | | |
|---|---|---|---|
| 0187335A1 | 7/1986 | European Pat. Off. | G06F 7/68 |
| 1470383 | 4/1977 | United Kingdom | H03K 5/00 |
| 2052815 | 1/1979 | United Kingdom | H03K 5/00 |
| 2136615 | 9/1984 | United Kingdom | H03K 3/72 |

OTHER PUBLICATIONS

"Frequenzsynthese MIT Numerisch Gesteuerten Oszillatoren" A. Rupp, Elektronic, 14, (1990) pp. 81–88.

*Primary Examiner*—Tan V. Mai
*Attorney, Agent, or Firm*—Michael E. Belk

[57] ABSTRACT

A circuit arrangement for frequency multiplication is described, by means of which a digital output signal is produced, the pulse repetition rate of which is obtained from one of the output signals by multiplication by an adjustable factor K. A high accuracy of the frequency of the output signal is obtained by the fact that an input counter is clocked by a digitally controlled oscillator and by the fact that the following means for controlling an output counter are provided:

- a register, in which counting positions of the input counter are temporarily stored,
- a comparator, which compares these counting positions to the counting positions of the output counter, and produces a pulse then when the comparison yields a predetermined result,
- a feedback between the comparator and the output counter in such a manner that the pulses from the comparator reset the output counter to its initial position.

9 Claims, 1 Drawing Sheet

CIRCUIT ARRANGEMENT FOR FREQUENCY MULTIPLICATION

This is a continuation of application Ser. No. 08/328,995, filed Oct. 25, 1994 now abandoned.

BACKGROUND OF THE INVENTION

1. Field of the Invention

The invention relates to a circuit arrangement for frequency multiplication. Circuit arrangements of this type produce from a periodic and digital input signal of—within limits—any frequency, a nominal periodic output signal. The frequency of the output signal is then obtained from the frequency of the input signal by multiplication by a factor of K—which is also freely adjustable within certain limits. The factor K will be designated coupling factor hereinafter.

2. Description of the Prior Art

A simple example for a circuit arrangement having the above function is a programmable frequency divider. In this case the coupling factor K is identical to the preset division ratio.

A further known example is what is commonly referred to as a digitally controlled oscillator. (Further details thereof are found in, for example, "ELEKTRONIK" 14, (1990) pages 81 to 88). In such an oscillator a digital output signal, which can be converted into an analog signal by a subsequent D/A converter, is produced by cyclic scanning of a truth table. Scanning this truth table is effected in synchronism with an applied clock frequency. In another type of programming of the oscillator the pulse sequences can be produced with a constant clock ratio.

The frequency $F_a$ of the output signal of a digitally controlled 32-bit oscillator is obtained from the frequency $F_c$ of the clock frequency, by which the oscillator is clocked, using the equation $$F_a = (DATA * F_c) : 2^{32}, \quad (1)$$

wherein DATA is a 32-bit long data word, which can be entered via a control input. In this case the fraction $DATA/2^{32}$ is the coupling factor K. A change in the output frequency $F_a$ can be effected without any delay, by applying a different data word to the control input of the oscillator.

Digitally controlled oscillators have the disadvantage that the frequency of the output signal cannot exceed approximately one quarter of the clock frequency, when importance is attached to only slightly disturbed output signals.

Finally the two above examples have the disadvantage, that the coupling factor K can basically not be higher than one. If, for example, an expert in the art is faced with the task of deriving the line frequency from a clock signal for a picture frequency, then the coupling factor K must be significantly higher than one.

A further similar task consists in deriving, from the tacho-pulse sequence of a film scanning system, the pulse sequence for scanning the lines of a film frame (this will be explained in the sequel of this description). Also in this case, for many of the usual standards a frequency-response ratio is obtained which requires a coupling factor K wherein K is greater than one. The above-described circuits are therefore not suitable for solving these tasks.

SUMMARY OF THE INVENTION

It is therefore an object of the invention, to provide a circuit arrangement for frequency multiplication having the above-described function, by means of which coupling factors can be obtained the value of which exceed one.

These objects are accomplished by means of an arrangement having the following circuit characteristics:

an input counter clocked by a first auxiliary clock pulse, an output copunter clocked by a second auxiliary clock pulse, means for controlling the counter.

Advantageous embodiments of the solution are defined in sub-claims.

BRIEF DESCRIPTION OF THE DRAWINGS

The invention will now be described in greater detail with reference to the accompanying Figures.

Herein.

DETAILED DESCRIPTION OF THE PREFERRED EMBODIMENT

Figure 1:
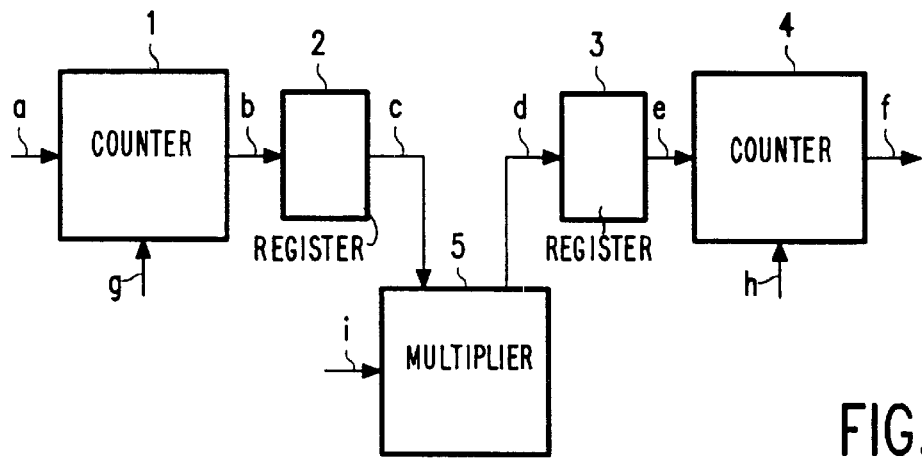
FIG. 1 illustrates a first variant of the solution.

In FIG. 1 a signal a is applied to an input counter, whose frequency is to be multiplied by an adjustable coupling factor K. Hereafter, for the sake of simplicity of the description, no difference is made between the designation of a signal and the reference numeral of a line over which this signal is conveyed further.

The signal a is applied to the reset input of the counter 1. This counter is clocked using a first auxiliary clock pulse g, which—depending on the desired accuracy—has a frequency which is significantly higher than the frequency of the signal a. Because of this wiring mode the input counter 1 measures the period of the signal a in units of the period of the auxiliary clock pulse g. The measuring result, namely the counting position reached by the input counter 1 at the occurrence of a reset pulse, is entered in a register 2 via a line b, and stored there. The content of the register 2 is applied to an input of a multiplier 5 via a line c. The second input of the multiplier receives a control word—designated DATA hereinafter—via a line i. The counter position and the control word are multiplied by each other and applied to a second register 3 via a line d. The output of the register 3 is in connection with an output counter 4 via a line e. The number stored in the second register 3 stipulates the counter position to which the output counter 4 must count before it is reset to its starting position. The output counter 4 is clocked by a second auxiliary clock pulse h. Once the output counter 4 has reached the position defined by the content of the register 3, then it delivers a pulse on a line f. This pulse sequence represents the output signal whose frequency $f_f$ is coupled to the frequency $F_a$ of the input signal a through a coupling factor K, which is obtained from the equation $$K = F_h / (DATA * F_g) \quad (2)$$

The formula 2 shows, that the coupling factor K can be varied in the example of FIG. 1 by changing the quantity DATA, since the frequencies $F_h$ and $F_g$ of the auxiliary clock pulses h and g can as a rule not be changed.

Theoretically there are no limits for the coupling factor K. In actual practice, however, the example of FIG. 1 has the disadvantage, that for an accurate realisation of the coupling factor defined by equation (2) a higher cost and design effort as regards the circuit-technical implementation is required. On deriving the equation (2) it was namely assumed, that the multiplier 5 determines the product of the sixteen-digit numbers c and DATA with an accuracy of 32 digits. To obtain such an accuracy, the output counter 4 must be a 32-stage counter. This cost and design effort is reduced, when the multiplier determines the product with an accuracy of 16 digits. Trimming the remaining digits has however for its consequence that the pulses in the signal f occur too early with a constantly increasing deviation. Consequently, a circuit as shown in FIG. 1 is not very suitable for those applications which require a high degree of accuracy.

Figure 2:
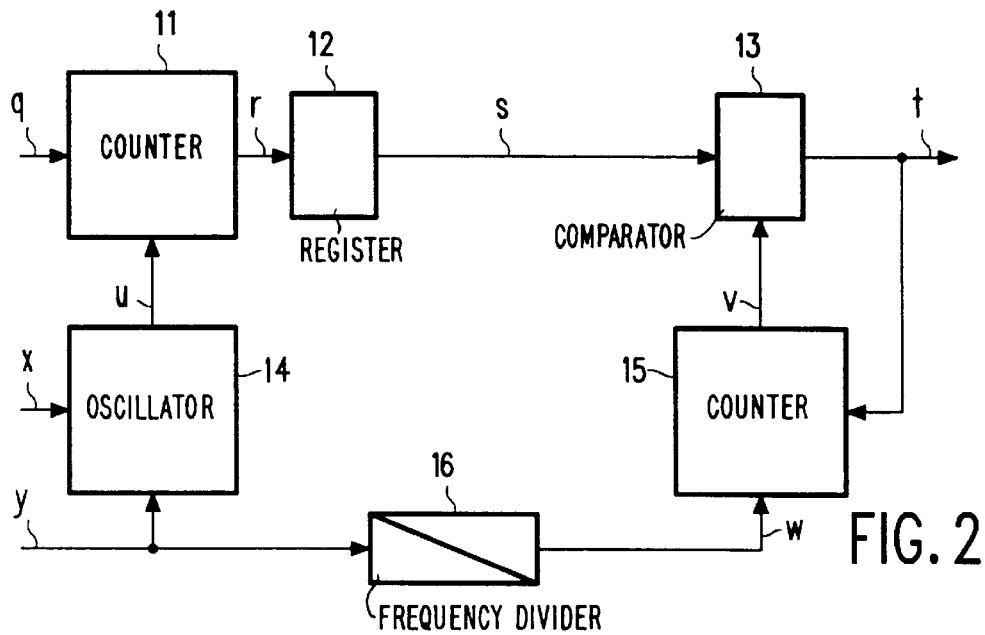
FIG. 2 illustrates a second variant of the solution.

A circuit arrangement requiring a similar low cost and design effort but which nevertheless is very accurate, is shown in FIG. 2. Also here a denotes the input signal which is applied to the reset input of an input counter 11. The counter is clocked by an auxiliary clock pulse u which corresponds to an output signal of a digitally controlled oscillator 14. The control data DATA are applied to the oscillator 14 via a line x. It is clocked by a clock pulse y. A register 12 has the same function as the register 2 in FIG. 1. The content of the register 12 is applied to a comparator 13 via a line s. The comparator 13 compares the content of the register 12 to the running position of an output counter 15, which position is applied to the comparator via a line v. The output counter is clocked by an auxiliary clock pulse w, which is obtained from the clock signal for the digitally controlled oscillator 14 by dividing it by means of a frequency divider 16. The divider 16 subdivides the clock pulse y in the ratio 1:N. As soon as the comparator 13 detects that the position of the output counter 15 exceeds the content of the register 12, it produces a pulse t, which is simultaneously used to reset the counter 15 to its starting position. For the coupling factor it is then obtained that $$K = 2^{32}/(DATA*N) \quad (3)$$

As can be seen from the equation (3), the possible settings of the coupling factor K are limited by the setting possibilities of the digitally controlled oscillator 14 and by the choice of N.

In order to still further increase the setting range of the coupling factor and consequently to enhance the flexibility of the circuit, also the second auxiliary clock pulse w is produced in an arrangement as shown in FIG. 2 by a further digitally controlled oscillator.

Figure 3:
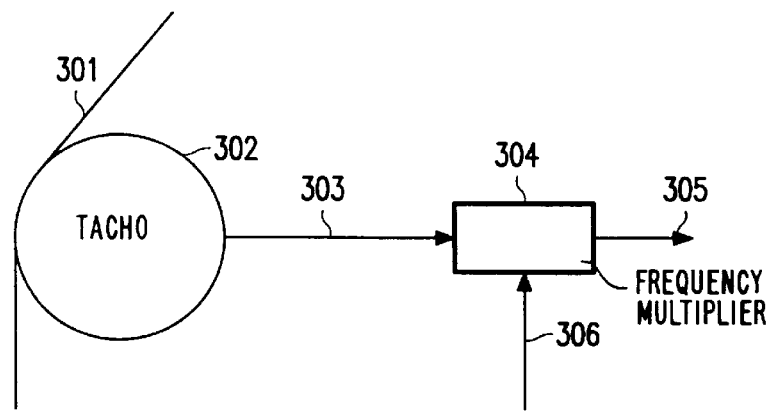
FIG. 3 shows a practical example of the invention.

FIG. 3 schematically shows the components of a film scanning system in so far as they are of interest for the present context. Such a system scans the pictures on a celluloid film 301 line-sequentially by means of a scanner (not shown). The scanning values are then stored in a picture store (also not shown) and thereafter prepared for a television transmission or for the production of a video film. The line scanning frequency depends, for example, on the video film format, in which the scanned data must be arranged.

The celluloid film 301 is pulled through the scanner by a film feed device (capstan) (not shown). The rate at which this is effected is converted by a tacho 302 into a pulse sequence 303, whose pulse repetition rate $F_T$ is proportional to the film speed. From this pulse sequence a circuit arrangement for frequency multiplication 304,306 produces a pulse sequence 305, whose frequency corresponds to the line scanning frequency $F_Z$. The pulse sequence 303 controls, for example, the scanner and an address generator for the picture store.

In accordance with the above, the following relation exists between the two quantities $F_z$ and $F_T$ $$F_z = K*F_T \quad (4)$$

with a coupling factor K still to be adjusted via a signal 306. The K to be adjusted is obtained from the quotients (desired number of lines per picture): (tacho pulses per picture).

To demonstrate in which order of magnitude the said parameters are found, a numerical example is given. For a 35-mm film the tacho produces 1169 pulses per picture. If a frame of the film 301 is to be scanned with 1250 lines, then the control data 306 must be chosen such, that a K having a value of 1250:1169=1.07 is obtained.

To ensure that the quality of the pictures is affected to the least possible extent by the scan procedure, an arrangement as shown in FIG. 2 is provided for frequency multiplication 304, 306.

I claim:

1. A circuit arrangement for frequency multiplication comprising:

an input counter which is clocked by a first auxiliary clock pulse;

a first register in which a count of the input counter is stored temporarily;

a multiplier which multiplies the count stored in the first register by a control data;

a second register in which a result of the multiplier is stored temporarily; and an output counter which is clocked by a second auxiliary clock pulse, the output counter being reset upon reaching the result stored in the second register.

2. The circuit arrangement of claim 1 wherein the first auxiliary clock pulse is an output from a first digitally controlled oscillator having an input clock.

3. The circuit arrangement of claim 2 wherein the second auxiliary clock pulse is the input clock subdivided by a divider.

4. The circuit arrangement of claim 2 wherein the second auxiliary clock pulse is an output from a second digitally controlled oscillator.

5. A circuit arrangement for frequency multiplication comprising:

an input counter which is clocked by a first auxiliary clock pulse;

a register in which a count of the input counter is temporarily stored;

an output counter which is clocked by a second auxiliary clock pulse;

a comparator which compares the count stored in the register with a count of the output counter and thereafter supplies a pulse when the comparison yields a predetermined result; and a feedback between the comparator and the output counter in such a manner that the pulse from the comparator resets the output counter to an initial position.

6. The circuit arrangement of claim 3 wherein the second auxiliary clock pulse is an output from a second digitally controlled oscillator.

7. The circuit arrangement of claim 5 wherein the first auxiliary clock pulse is an output from a first digitally controlled oscillator having an input clock.

8. A film scanning system comprising:

a tacho which supplies a first auxiliary clock pulse sequence having a repetition rate proportional to a speed of the film to be scanned;

an input counter which is clocked by the first auxiliary clock pulse sequence;

a first register in which a count of the input counter is stored temporarily.

a multiplier which multiplies the count stored in the first register by a control data;

a second register in which a result of the multiplier is stored temporarily; and an output counter which is clocked by a second auxiliary clock pulse sequence, the output counter reset upon reaching the result stored in the second register, whereby the output counter delivers a scanning pulse upon reaching the result stored in the second register, the scanning pulse occurring at a rate corresponding to a line scanning frequency.

9. A film scanning system comprising:

a tacho which supplies a first auxiliary clock pulse sequence having a repetition rate proportional to a speed of the film to be scanned;

an input counter which is clocked by the first auxiliary clock pulse sequence;

a register in which a count of the input counter is temporarily stored;

an output counter which is clocked by a second auxiliary clock pulse sequence;

a comparator which compares the count stored in the register with a count of the output counter and thereafter supplies a scanning pulse when the comparison yields a predetermined result, the scanning pulse occurring at a rate corresponding to a line scanning frequency; and a feedback between the comparator and the output counter in such a manner that the pulse from the comparator resets the output counter to an initial position.

* * * * *